(12) United States Patent
Shin et al.

(10) Patent No.: US 9,503,115 B1
(45) Date of Patent: Nov. 22, 2016

(54) CIRCUIT FOR AND METHOD OF IMPLEMENTING A TIME-INTERLEAVED ANALOG-TO-DIGITAL CONVERTER

(71) Applicant: Xilinx, Inc., San Jose, CA (US)

(72) Inventors: Jaewook Shin, San Jose, CA (US);
Hiva Hedayati, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/048,720

(22) Filed: Feb. 19, 2016

(51) Int. Cl.
| | |
|---|---|
| H03M 1/50 | (2006.01) |
| H03M 1/12 | (2006.01) |
| H03M 1/08 | (2006.01) |
| H03M 1/00 | (2006.01) |

(52) U.S. Cl.
CPC ........... *H03M 1/1215* (2013.01); *H03M 1/002* (2013.01); *H03M 1/0836* (2013.01)

(58) Field of Classification Search
CPC ........... H03M 1/0631; H03M 1/0614; H03M 1/1245; H03M 1/1215; H03M 1/0836; H03M 1/167; H03M 1/002; H03M 1/804; H03M 1/1071; H03M 1/1038; H03M 1/0624
USPC ................................................. 341/140–166
See application file for complete search history.

(56) References Cited

U.S. PATENT DOCUMENTS

| | | | |
|---|---|---|---|
| 6,246,258 B1 | 6/2001 | Lesea | |
| 6,351,145 B1 | 2/2002 | Lesea | |
| 6,642,751 B1 | 11/2003 | Quinn | |
| 6,653,827 B2 | 11/2003 | Gaither et al. | |
| 6,677,879 B1 | 1/2004 | Nix et al. | |
| 6,784,824 B1 | 8/2004 | Quinn | |
| 6,975,132 B2 | 12/2005 | Groen | |
| 7,138,815 B1 | 11/2006 | Alexander et al. | |
| 7,378,999 B1 | 5/2008 | McGrath et al. | |
| 7,916,050 B1 | 3/2011 | Mujica et al. | |
| 8,184,029 B1 | 5/2012 | Hsieh et al. | |
| 8,390,372 B2 * | 3/2013 | Buter | H03F 3/005 330/9 |
| 8,487,795 B1 * | 7/2013 | Jiang | G11C 27/024 327/415 |

(Continued)

OTHER PUBLICATIONS

Duan, Yida et al., "A 12.8 GS/s Time-Interleaved ADC with 25 GHz Effective Resolution Bandwidth and 4.6 ENOB," IEEE Journal of Solid-State Circuits, Aug. 2014, pp. 1725-1738, vol. 49, No. 8, IEEE, Piscataway, New Jersey, USA.

(Continued)

*Primary Examiner* — Lam T Mai
(74) *Attorney, Agent, or Firm* — John J. King

(57) ABSTRACT

A circuit for implementing a time-interleaved analog-to-digital converter is described. The circuit comprises a sampling clock generator configured to receive a reference clock signal having a first frequency. The sampling clock generator has a first stage sampling clock generator configured to generate a first plurality of clock signals based upon the reference clock signal and having a second frequency, and a second stage sampling clock generator configured to generate, for each clock signal of the first plurality of clock signals, a second plurality of clock signals having a third frequency; a first stage having a plurality of switches configured to receive an analog input signal, wherein each switch of the plurality of switches is controlled by a corresponding clock signal of the first plurality of clock signals; and a second stage having a plurality of analog-to-digital converter banks, each analog-to-digital converter bank having a plurality of analog-to-digital converters and configured to receive the analog input signal by way of a corresponding switch of the plurality of switches.

20 Claims, 11 Drawing Sheets

(56) References Cited

U.S. PATENT DOCUMENTS

| | | | |
|---|---|---|---|
| 8,538,039 B2* | 9/2013 | Pfaffinger | H04R 29/001 |
| | | | 381/59 |
| 8,766,832 B1 | 7/2014 | Bogue | |
| 8,830,094 B1 | 9/2014 | Erdmann | |
| 8,890,739 B2 | 11/2014 | Lewis et al. | |
| 8,902,094 B1* | 12/2014 | Zhang | 341/122 |
| 8,917,125 B1 | 12/2014 | Waltari | |
| 8,947,284 B2* | 2/2015 | Ishii | H03M 1/1023 |
| | | | 341/118 |
| 8,970,419 B2 | 3/2015 | Farley et al. | |
| 9,048,860 B1 | 6/2015 | Quinn | |
| 9,059,722 B2* | 6/2015 | Hsu | H03M 1/0624 |
| 9,209,825 B1* | 12/2015 | Visani | H03M 1/0626 |
| 9,337,853 B2* | 5/2016 | Nakamura | H03M 1/0624 |
| 2008/0284625 A1* | 11/2008 | Joy | H03M 1/002 |
| | | | 341/123 |
| 2011/0260898 A1 | 10/2011 | Velazquez | |
| 2012/0075129 A1 | 3/2012 | Kidambi | |

OTHER PUBLICATIONS

Huang, Chun-Cheng et al., "A CMOS 6-Bit 16-GS/s Time-Interleaved ADC Using Digital Background Calibration Techniques," IEEE Journal of Solid-State Circuits, Apr. 2011, pp. 848-858, vol. 46, No. 4, IEEE, Piscataway, New Jersey, USA.

* cited by examiner

CIRCUIT FOR AND METHOD OF IMPLEMENTING A TIME-INTERLEAVED ANALOG-TO-DIGITAL CONVERTER

TECHNICAL FIELD

The present invention relates generally to integrated circuit devices, and in particular, to a circuit for and a method of implementing a time-interleaved analog-to-digital converter.

BACKGROUND

Data transmission is an important function in many integrated circuit devices. As bandwidth requirements of wireline and wireless transceiver systems becomes stringent, a sampling clock generator is a significant component as it produces critical clocking signals.

However, conventional time-interleaved (TI) analog-to-digital (ADC) circuits require significant area and power, and may suffer from high jitter and clock timing skew. Conventional TI ADCs may use a phase interpolator or a delay-locked loop for multiple phase clock generation, each of which has disadvantages. While a phase interpolator based clock generator is suitable for high-speed operation, it consumes large power and area. A delay-lock loop based TI ADC may have a small size compared with phase interpolator based TI ADC, but does not provide a good architecture for high-speed operation because a phase detector offset and delay mismatch between the delay cells may result in non-linearity that can limit operation speed.

Accordingly, circuits and methods that implement an analog-to-digital converter that reduce size, power consumption and noise, and also enable high speed operation are beneficial.

SUMMARY

A circuit for implementing a time-interleaved analog-to-digital converter circuit is described. The circuit comprises a sampling clock generator configured to receive a reference clock signal having a first frequency, the sampling clock generator having a first stage sampling clock generator configured to generate a first plurality of clock signals based upon the reference clock signal and having a second frequency, and a second stage sampling clock generator configured to generate, for each clock signal of the first plurality of clock signals, a second plurality of clock signals having a third frequency; a first stage having a plurality of switches configured to receive an analog input signal, wherein each switch of the plurality of switches is controlled by a corresponding clock signal of the first plurality of clock signals; and a second stage having a plurality of analog-to-digital converter banks, each analog-to-digital converter bank having a plurality of analog-to-digital converters and configured to receive the analog input signal by way of a corresponding switch of the plurality of switches; and wherein each analog-to-digital converter bank of the plurality of analog-to-digital converter banks is configured to receive a plurality of clock phases of a corresponding clock signal of the second plurality of clock signals.

A method of implementing a time-interleaved analog-to-digital converter is also described. The method comprises configuring a sampling clock generator to receive a reference clock signal having a first frequency; generating, by the sampling clock generator, a first plurality of clock signals based upon the reference clock signal and having a second frequency; generating, for each clock signal of the first plurality of clock signals, a second plurality of clock signals having a third frequency; receiving an analog input signal at a plurality of switches, wherein each switch of the plurality of switches is controlled by a corresponding clock signal of the first plurality of clock signals; and implementing a plurality of analog-to-digital converter banks, each analog-to-digital converter bank having a plurality of analog-to-digital converters and configured to receive the analog input signal by way of a corresponding switch of the plurality of switches; wherein each analog-to-digital converter bank of the plurality of analog-to-digital converter banks is configured to receive a plurality of clock phases of a corresponding clock signal of the second plurality of clock signals.

Other features will be recognized from consideration of the Detailed Description and the Claims, which follow.

BRIEF DESCRIPTION

DETAILED DESCRIPTION

Figure 1:
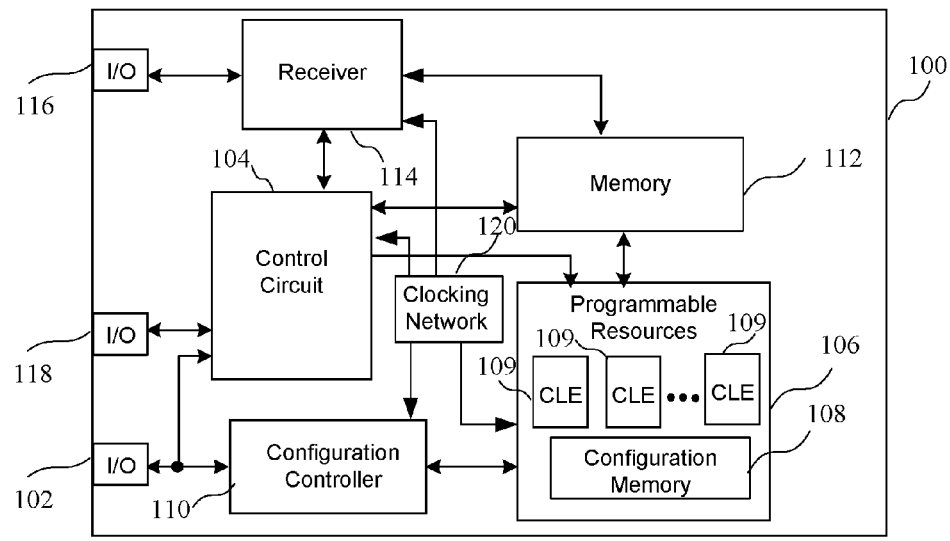
FIG. 1 is a block diagram of an integrated circuit 100 comprising a receiver circuit for implementing time-interleaved analog-to-digital converter circuits.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods set forth below relate to a low-power, low-area sampling clock generation architecture for multi-step sampling to enable high-speed, time-interleaved analog-to-digital converters. Low-power, low-area and high spectral purity are achieved through utilizing frequency clock dividers compared to conventional devices that use phase interpolators or delay-lock loops. The circuits and methods can significantly reduce circuit complexity, and provide high flexibility in selecting any number of sub-channels in multi-step and single-step sampling TI ADCs. The small size and low complexity of the circuits allow it to consume low power and reduced area, as well as low jitter and clock timing skew, which are critical for high speed operation (i.e. wide-bandwidth applications). Also, output clock phase order between sampling clock generators can be achieved by synchronizing an external reset signal to one branch of clock generator and retiming the synchronized reset in the next branches.

A circuit for implementing a time-interleaved analog-to-digital converter may comprise a sampling clock generator having a first stage sampling clock generator generating a first plurality of clock signals based upon a reference clock signal and having a second frequency, and a second stage sampling clock generator generating, for each clock signal of the first plurality of clock signals, a second plurality of clock signals having a third frequency. A first stage has a plurality of switches configured to receive an analog input signal, wherein each switch is controlled by a corresponding clock signal of the first plurality of clock signals. A second stage has a plurality of analog-to-digital converter banks, where each analog-to-digital converter bank has a plurality of analog-to-digital converters and is configured to receive the analog input signal by way of a corresponding switch of the plurality of switches. Each analog-to-digital converter bank is configured to receive a plurality of clock phases of a corresponding clock signal of the second plurality of clock signals. Implementations having additional stages for routing clocks signals are also described.

Turning first to FIG. 1, a block diagram of an integrated circuit 100 comprising a receiver circuit for implementing time-interleaved analog-to-digital converter circuits as described in FIGS. 2-20 is shown. In particular, an input/output port 102 is coupled to a control circuit 104 that controls programmable resources 106 having configuration memory 108. Configuration data may be provided to the configuration memory 108 by a configuration controller 110. The configuration data enables the operation of configurable logic elements 109. A memory 112 may be coupled to the control circuit 104 and the programmable resources 106. A receiver circuit 114 may be coupled to the control circuit 104, programmable resources 106 and the memory 112, and may receive signals at the integrated circuit by way of I/O port 116. Other I/O ports may be coupled to circuits of the integrated circuit device, such as I/O port 118 that is coupled to the control circuit 104 as shown. A clocking network 120 is coupled to various elements of the circuit of FIG. 1.

Figure 2:
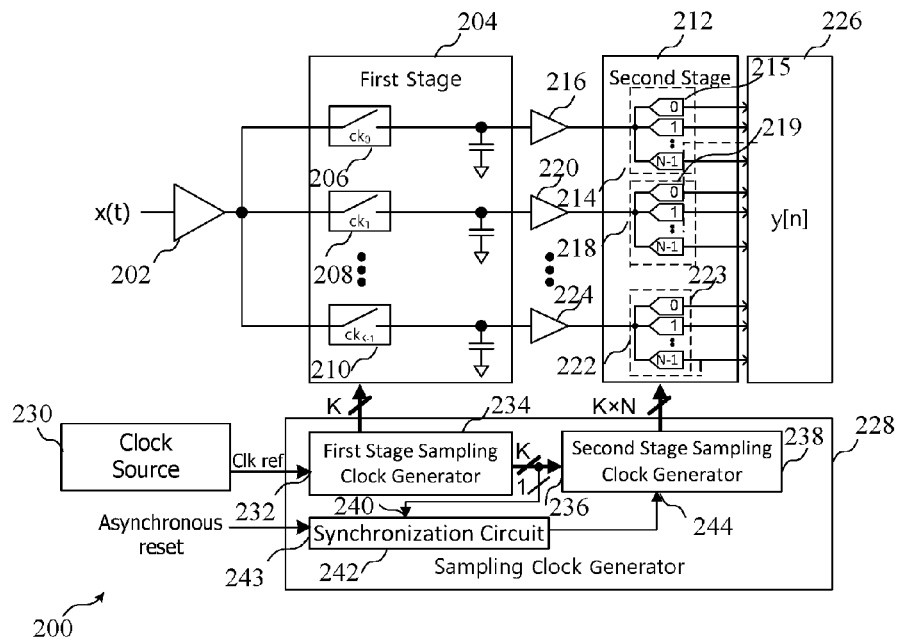
FIG. 2 is a block diagram of circuit 200 for implementing a time-interleaved analog-to-digital converter.

Turning now to FIG. 2, a block diagram of circuit for implementing a time-interleaved analog-to-digital converter is shown. In particular, a first amplifier 202 is coupled to receive an analog input signal x(t) that is provided to a plurality of signal paths, where each signal path has a plurality of ADC circuits. The amplified analog input signal x(t) is provided by way of the first amplifier 202 to a first stage 204 at a plurality of switches 206-210, shown here by way of example as K switches. As will be described in more detail below, the switches of the first stage 204 are sequentially selected to enable time multiplexing of the ADC circuits of the plurality of banks of a second stage 212. A first bank of ADC circuits 214 having N ADC circuits 215 is coupled to an amplifier circuit 216 that is configured to receive the analog input signal x(t) by way of the first switch 206. Each of the K switches and the N ADC circuits is configured to receive a corresponding clock signal. That is, a first clock signal (coupled to the first bank 214 of ADC circuits 215 for example) is divided into N clock signals, where each of the N clock signals is coupled to a corresponding one of the N ADC banks of the first bank 214. The first bank 214 having N ADC circuits 215 is configured to receive the analog input signal x(t) by way of the first switch 206. Similarly, a second bank of ADC circuits 218 having N ADC circuits 219 is coupled to an amplifier circuit 220 and configured to receive the analog input signal x(t) by way of the second switch 208. Finally, a Kth bank of ADC circuits 222 having N ADC circuits 223 is coupled to an amplifier circuit 224 that is coupled to receive the analog input signal x(t) by way of the Kth switch 210. Outputs of the ADC banks are provided to memory element 226 that stores the digital output y[n] that is representative of the analog input signal x(t).

The circuit of FIG. 2 further comprises a sampling clock generator 228 that is configured to receive a reference clock ($Clk_{ref}$) signal from a clock source 230. The reference clock signal is routed to a clock input 232 of a first stage sampling clock generator 234, which generates K clock signals that are coupled to both the first stage 204 and an input 236 of a second stage sampling clock generator 238. The second stage sampling clock generator 238 generates K×N clock signals to apply a clock signal to a corresponding ADC of the K×N ADCs. More particularly, N clock signals will be generated for each of the K clock signals generated by the first stage sampling clock detector, where each of the N clock signals associated with a given clock signal of the K clock signals is routed to a clock input of a corresponding ADC circuit of the ADC bank associated with the given clock signal of the K clock signals. One of the clock signals of the K clock signals is coupled to an input 240 of a synchronization circuit 242 that is also coupled to receive an asynchronous reset signal at an input 243. A synchronization signal is routed to an input 244 of the second stage sampling clock generator 238. As will be described in more detail below, the synchronization circuit 242 ensures that outputs of the second stage 212 are generated in the desired order to create the correct digital output y[n].

Therefore, the circuit of FIG. 2 provides a two-step sampling TI ADC architecture having K branches with N sub-samplers per branch. The associated sampling clock generator 228 ensures that the correct branch of the first stage is selected by a first plurality of clock signals, and the correct ADC circuit of the second stage is selected by a second plurality of clock signals. That is, the analog input x(t) is sampled by each channel and interleaved in the time domain by the first stage, and the 2nd stage operates as a single-step TI ADC for the data sampled by the first stage. The first stage 204 has K branches that are coupled to receive a corresponding sampling clock generated from the first stage sampling clock generator 234, where the duty cycle of K sampling clock signals is less than 100/K percent to ensure there is no overlap between the K sampling clocks.

The second stage 212 in the TI ADC receives K×N sampling clock signals from the second stage sampling clock generator 238. The second stage sampling clock generator contains K sets of frequency dividers and related logic gates, where each set generates N phase sampling clock signals to generate K×N clock signals. The N phase sampling clock signals on each branch has a duty cycle less than 100/N percent to ensure there is no overlap between the N phase sampling clock signals. The synchronization circuit 242 efficiently guarantees clock phase order between K×N sampling clock signals based upon an asynchronous reset signal and minimizes hardware resources to provide clock phase order. The output of each channel (comprising a total of K×N channels) is processed in digital domain to obtain the converted digital output y[n] of the analog input x(t).

Figure 3:
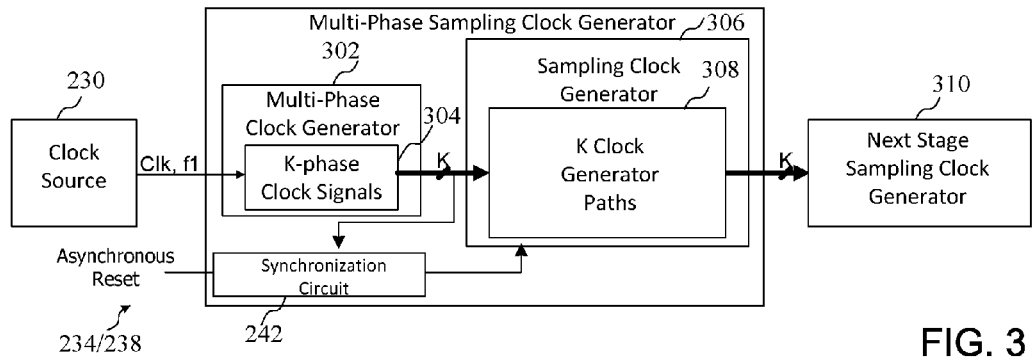
FIG. 3 is a block diagram of a sampling clock generator that may be implemented as a first stage sampling clock generator 234 and as a second stage sampling clock generator 238 of FIG. 2.

Turning now to FIG. 3, a block diagram of a sampling clock generator that may be implemented as both a first stage sampling clock generator 234 and as a second stage sampling clock generator 238 is shown. The example of FIG. 3 shows the implementation of a first stage sampling clock generator that receives a clock signal, shown here as Clk having a first frequency (f1), from the clock source and generates K clock signals at a second frequency (f2). The multi-phase sample clock generator of FIG. 3 comprises a multi-phase clock generator 302 having a signal generator 304 for generating k phase clock signals. If implemented as a second stage sampling clock generator 328, the multi-phase clock generator 302 would receive a particular phase of a clock signal having the second frequency f2 generated by the first stage sampling clock generator 234. The K clock signals having the k phases are coupled to K clock generator paths 308, where each clock generator path of the K clock generator paths 308 receives a corresponding clock signal at a frequency f2. The K clock signals are provided to the next stage sampling clock generator 310 (or the second stage 212 if the circuit of FIG. 3 is implemented as a second sampling clock generator 238).

Accordingly, FIG. 3 is a generalized block diagram of a multi-phase sampling clock generator for generating any number of sampling clock signals, shown here by way of example as K. The multi-phase sampling clock generator can be used as a sampling clock generator for each sampling stage. For K-channel sampling clock generation, the multi-phase clock generator in FIG. 3 can be a frequency divider with a division ratio of K/2 operating at the input clock source frequency f1. In the example of FIG. 3, it generates two 50% duty cycle clock signals at the output, where K equals 4. The sampling clock generator 306 produces, at the K clock generator paths 308, K sampling clock signals at multiple phases which is given by:

$$\frac{360}{K}n \text{ and } \frac{360}{K}n\left(\frac{K}{2}+n+1\right),$$

$0 \le n \le K-1$, where n is an integer.

The duty cycle of the K sampling clocks is less than 100/K percent to avoid any overlap between sampling clock signals. Depending on the number of phases required, the division ratio K/2 may vary. Therefore, the configuration of frequency divider may also change.

The frequency divider of the multi-phase clock generator 302 can be an asynchronous or a synchronous, as will be described below in reference to FIGS. 18-20. While an asynchronous divider will limit division ratio to be any number which is a power of 2, a synchronous divider can generate any even number of phases. When implemented as a second stage sampling clock generator, the circuit of FIG. 3 would be configured to receive a reset signal from the synchronization circuit 242, as described in more detail below in reference to FIG. 5. While specific circuits implemented as a multi-phase clock generator and a sampling clock generator may vary, the circuit of FIG. 3 provides a basic architecture for generating a divided clock, and the particular divided clocks that are provided to a next stage, which may be a second stage sampling clock generator when the circuit of FIG. 3 is implemented as a first stage sampling clock generator or the ADC banks when implemented as a second stage sampling clock generator.

Figure 4:
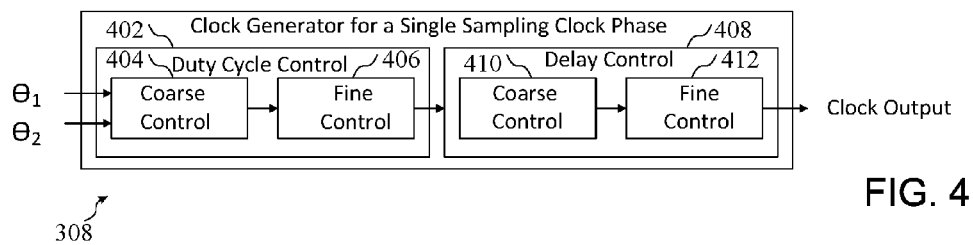
FIG. 4 is a block diagram showing a clock generator path of the clock generator paths 308 of FIG. 3.

Turning now to FIG. 4, a block diagram shows a clock generator path of the K clock generator paths 308 of FIG. 3. In particular, FIG. 4 shows a sub-block within the sampling clock generator that receives a plurality of sampling clock signals and produces a single phase sampling clock signal. The input of this block is typically two of the K clock signals representing two phases of the reference clock signal for duty cycle control to avoid any overlapping between output clock signals, which may cause severe degradation in linearity. It provides both duty cycle control and delay control, both of which can be configured with coarse and fine controls. More particularly, a duty cycle control circuit 402 comprises a coarse duty cycle control circuit 404 configured to receive the two phases designated as $\theta_1$ and $\theta_2$ of the clock signal, and a fine control circuit 406. In the duty cycle control, the coarse control generates a certain duty cycle clock depending on the TI ADC timing requirement, and a fine control may be used to enable non-overlapping between clock signals over process, voltage, and temperature variations. For example, the coarse duty cycle control may comprise logic gates, such as AND gates and inverters, while fine duty cycle control may comprise tunable load (e.g. a C load or RC load depending on the purpose), for example. A delay control circuit 408 is also provided, including a coarse control circuit 410 and a fine control circuit 412. The coarse control and fine control of delay control circuit 408 are implemented to compensate for any clock timing skew mismatch between the channels. They may be controlled by a background or foreground calibration algorithm in a digital, analog, and/or mixed-signal domain.

Figure 5:
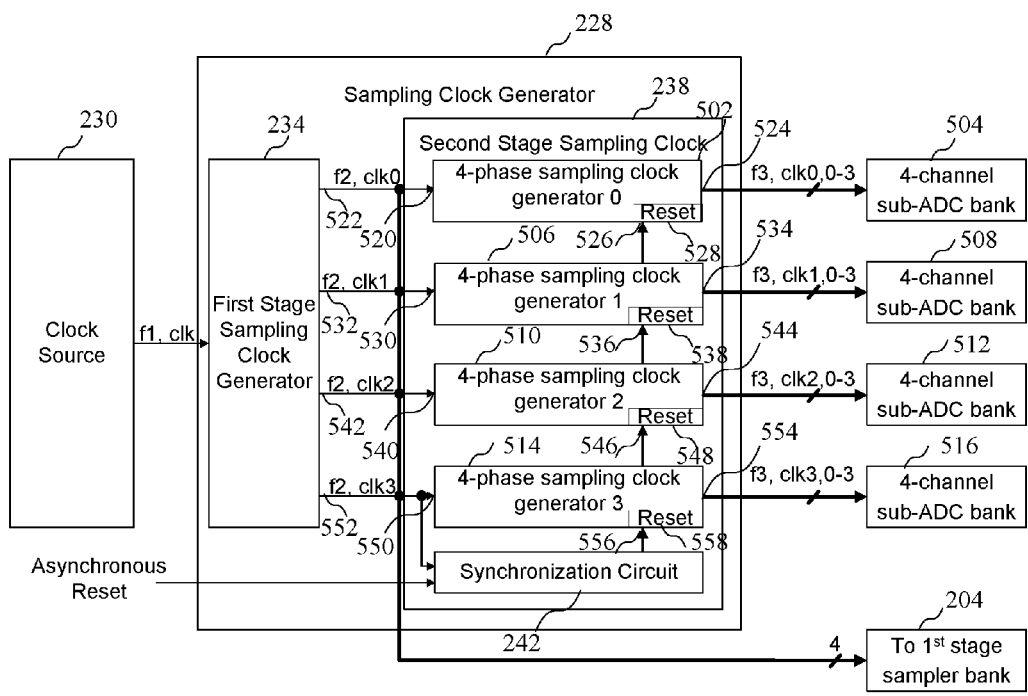
FIG. 5 is a block diagram showing additional details for implementing the sampling clock generator 228 of FIG. 2.

Turning now to FIG. 5, a block diagram shows additional details for implementing the sampling clock generator 228 of FIG. 2, and more particularly, more details of the second stage sampling clock generator 238. The second stage sampling clock generator 238 comprises a plurality of sampling clock generators, shown here as 4-phase sampling clock generators each generating 4 different phases of one of the K clock signals. The 4 different phases are provided to the 4 ADCs of a corresponding bank of ADCs as shown in FIG. 2. The implementation of 4-phase sampling clock circuits is shown by way of example. However, it should be understood that the sampling clock generator implemented in the second stage sampling clock generator could be implemented to generate any number of phases of a clock signal based upon a clock signal generated by the first stage sampling clock generator 234.

In addition to being routed to corresponding switches of the first stage sampling clock circuit 204, the clk0, clk1, clk2, and clk3 signals are routed to the second stage sampling clock generator 238. The second stage sampling clock circuit 238 comprises a first 4-phase sampling clock generator 502 that generates 4 phases of clk 0 (i.e. clk0, 0 through clk0, 3) at a third frequency (f3). The 4 phases of the clk 0 that are provided to a 4 channel sub-ADC bank 504, where each of the 4 phases is provided to a corresponding ADC circuit of the 4 channel sub-ADC bank 504. The 4 channel sub-ADC bank 504 could be ADC bank 214 of FIG. 2, for example. The second stage sampling clock circuit 238 also comprises a second 4-phase sampling clock generator 506 that generates 4 phases of clock 1 (clk1, 0 through clk1, 3) at the third frequency f3 that are provided to a 4 channel sub-ADC bank 508. The second stage sampling clock circuit 238 further comprises a third 4-phase sampling clock generator 510 that generates 4 phases of clock 2 (clk2, 0 through clk2, 3) at the third frequency f3 that are provided to a 4 channel sub-ADC bank 512. Finally, the second stage sampling clock circuit 238 comprises a fourth 4-phase sampling clock generator 514 that generates 4 phases of clock 2 (clk2, 0 through clk2, 3) at the third frequency f3 that are provided to a 4 channel sub-ADC bank 516.

More particularly, the 4-phase sampling clock generator 502 receives the clk0 signal having the second frequency f2 at an input 520 by way of an output 522 of the first stage sampling clock generator 234, and generates 4 phases of clk0 at the third frequency f3 at an output 524. The 4-phase sampling clock generator 506 receives the clk1 signal having the second frequency f2 at an input 530 by way of an output 532 of the first stage sampling clock generator 234, and generates 4 phases of clk1 at the third frequency f3 at an output 534. The 4-phase sampling clock generator 510 receives the clk2 signal having the second frequency f2 at an input 540 by way of an output 542 of the first stage sampling clock generator 234, and generates 4 phases of clk2 at the third frequency f3 at an output 544. The 4-phase sampling clock generator 514 receives the clk3 signal having the second frequency f2 at an input 550 by way of an output 552 of the first stage sampling clock generator 234, and generates 4 phases of clk3 at the third frequency f3 at an output 554.

The synchronization circuit 242 is configured to provide a reset signal to a reset circuit of each of the 4-phase sampling clock generators, where a reset of the 4-phase sampling clock generators is synchronized to a clock signal that is routed to the 4-phase sampling clock generator. More particularly, a reset signal is coupled to an input 526 of a reset circuit 528 of the 4-phase sampling clock generator 502, an input 536 of a reset circuit 538 of the 4-phase sampling clock generator 506, an input 546 of a reset circuit 548 of the 4-phase sampling clock generator 510, and an input 556 of a reset circuit 558 of the 4-phase sampling clock generator 514. Reset synchronization and its propagation to the next sampling clock generator is required to ensure phase order between K×N sampling clock signals (i.e. the 16-phase clock signals routed to the 4-channel sub-ADC banks 504, 508, 512, and 516 in FIG. 5).

Each synchronized signal generated by a reset circuit of the 4-phase sampling clock generator is synchronized to a clock signal coupled to the 4-phase sampling clock generator. The synchronization circuit 242 receives clk3 from the first stage sampling clock generator 234 and propagates a synchronization signal to 4-phase sampling clock generator 514 in the second stage sampling clock generator 238 which also receives clk3 as its clock. The synchronized reset is propagated to the 4-phase sampling clock generator 510 and retimed by clk2 to properly order clock phases. That is, a synchronization signal associated with a reset is generated by each reset circuit of the 4-phase sampling clock generators, where the synchronization signal is synchronized to a clock signal routed to that 4-phase sampling clock generator. The synchronized reset is propagated to the next stages. That is, the synchronized reset is propagated to the 4-phase sampling clock generator 506 and retimed by clk1 and the synchronized reset is propagated to the 4-phase sampling clock generator 502 and retimed by clk0. This synchronization of the reset signal can ensure clock phase order, thus the data order generated at the output of the TI ADC as the digital value y[n]. Otherwise, all the output data order will be erroneous, resulting in an erroneous output y[n].

Figure 6:
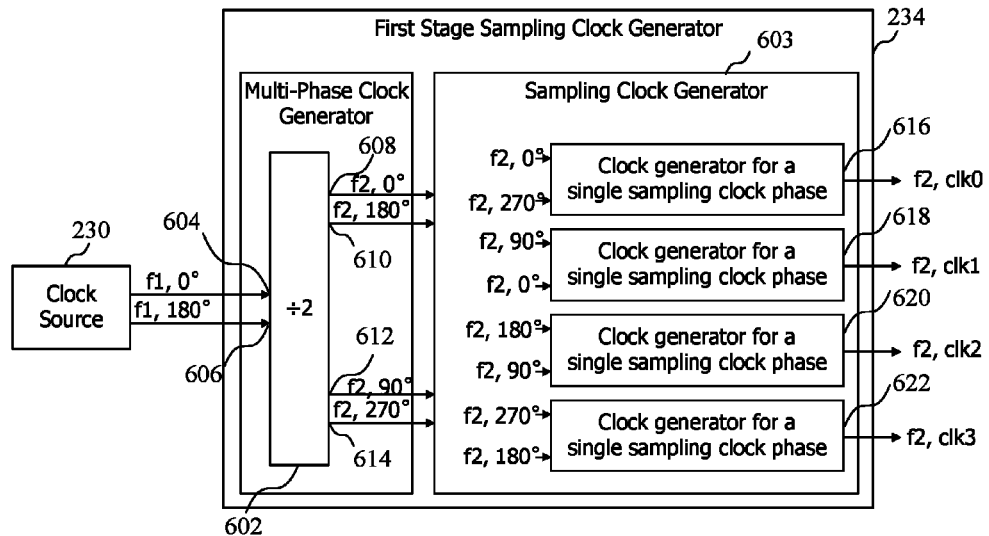
FIG. 6 is a block diagram of a circuit for implementing the first stage sampling clock generator 234 of FIG. 5.

Turning now to FIG. 6, a block diagram of a circuit for implementing the first stage sampling clock generator of FIG. 5 is shown. The first sampling clock generator 234 comprises a "divide-by-2" frequency divider circuit 602 and a sampling clock generator 603, which includes four single phase sampling clock generators, where output clocks of the single phase sampling clock generators have a duty cycle less than 25% (i.e. when K is equal to 4). More particularly, two clock signals of the first frequency f1 (shown here as f1, 0° and f1, 180°) are coupled to inputs 604 and 606 of the frequency divider circuit 602. The divided clock signals at the second frequency (i.e. f2, 0°, f2, 180°, f2, 90°, and f2, 270°) are coupled to sampling clock generators 616, 618, 620, and 622, each of which is a clock generator that generates a single sampling clock phase. The sampling clock generator 603 therefore generates the clock signals clk0, clk1, clk2, and clk3 at the second frequency f2 and having different phases, as well as a different duty cycle compared to the clock signals generated by the frequency divider circuit 602, as shown and will be described in reference to FIG. 7.

Figure 7:
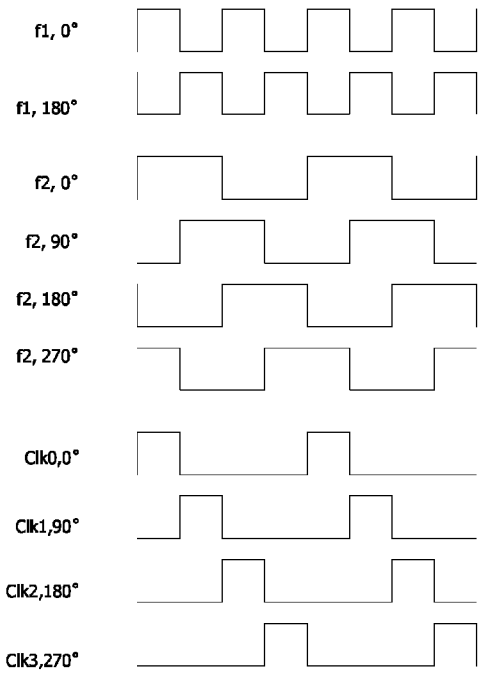
FIG. 7 is a timing diagram showing the generation of clock signals using the first stage sampling clock generator of FIG. 6.

Therefore, quadrature-phase sampling clock signals can be generated by using a divide-by-2 frequency divider and four single phase sampling clock generators. A divide-by-2, which is used as a multi-phase clock generator, produces quadrature clock signals with 50% duty cycle (f2, 0°, f2, 90°, f2, 180°, and f2, 270° as shown in FIG. 7). The sampling clock generators receive the quadrature 50% duty cycle clock signals, and generates quadrature clock signals at 0°, 90°, 180°, and 270° with a duty cycle a bit less than 25% (Clk0, 0°, Clk1, 90°, Clk2, 180°, and Clk3, 270°) to avoid clock signal overlapping.

Figure 8:
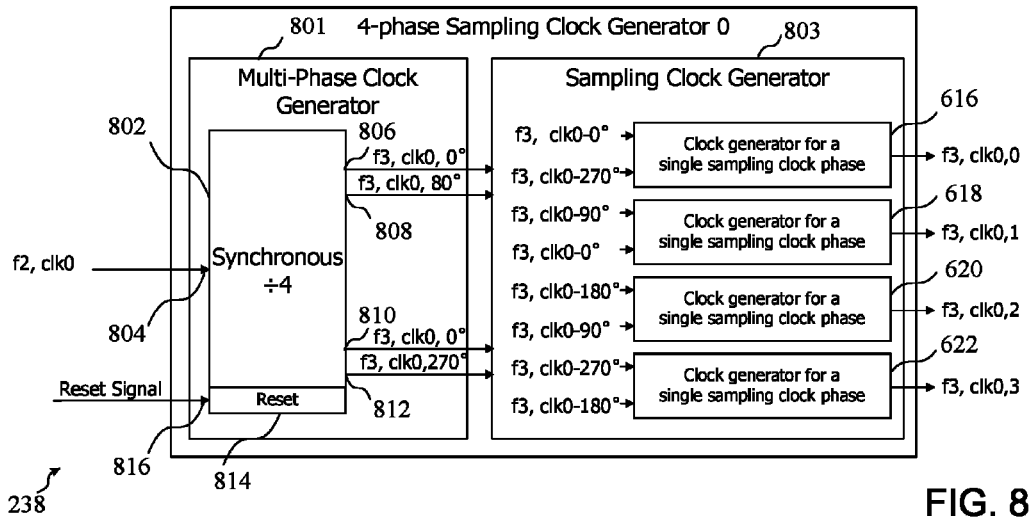
FIG. 8 is a block diagram of a circuit for implementing a second stage sampling clock generator 238 of FIG. 5.

Turning now to FIG. 8, a block diagram of a circuit for implementing a 4-phase sampling clock generator of a second stage sampling clock generator 238 is shown. That is, the circuit of FIG. 8 could be implemented as any one of the 4-phase sampling clock generators 502, 506, 510 and 514 of FIG. 5 for example. The 4-phase sampling clock generator of a second stage sampling clock generator 238 comprises a multi-phase clock generator 801 having a synchronous "divide-by-4" clock divider circuit 802, and a sampling clock generator 803 having four single phase sampling clock generators. A clock signal having the second frequency, shown here as clk0, is coupled to an input 804 of the synchronous divide-by-4 clock divider circuit 802, where divided clock signals having the frequency f3 are generated, shown here as clk0, 0° generated at an output 806, clk0, 180° generated at an output 808, clk0, 90° generated at an output 810, clk0, 270° generated at an output 812. That is, in contrast to the circuit having a divide-by-2 circuit for generating the 4 divided clock signals based upon two input signals, the synchronous "divide-by-4" clock divider circuit 802 generates 4 clock signals at the third frequency f3 based upon a single phase of the clk0 signal having the second frequency. The output clock signals clk0,0, clk0,1, clk0,2, and clk0,3 have a duty cycle less than 25% (which is 100/4 percent in the example of FIG. 8, or 100/N in the general case having N ADC circuits per ADC banks) are generated. According to the implementations of FIGS. 6 and 8, the input clock coupled to the first stage sampling clock generator 234 is at frequency 'f1' which is differential, 'f2' is a frequency after the clock divider that generates quadrature signals, and clk0, 0 through clk0, 3 having clock frequency f3 are the output of the sampling clock generator of the sampling clock generator 803 of the second stage sampling clock generator 238. A reset circuit 814 is configured to receive a reset signal at an input 816.

Figure 9:
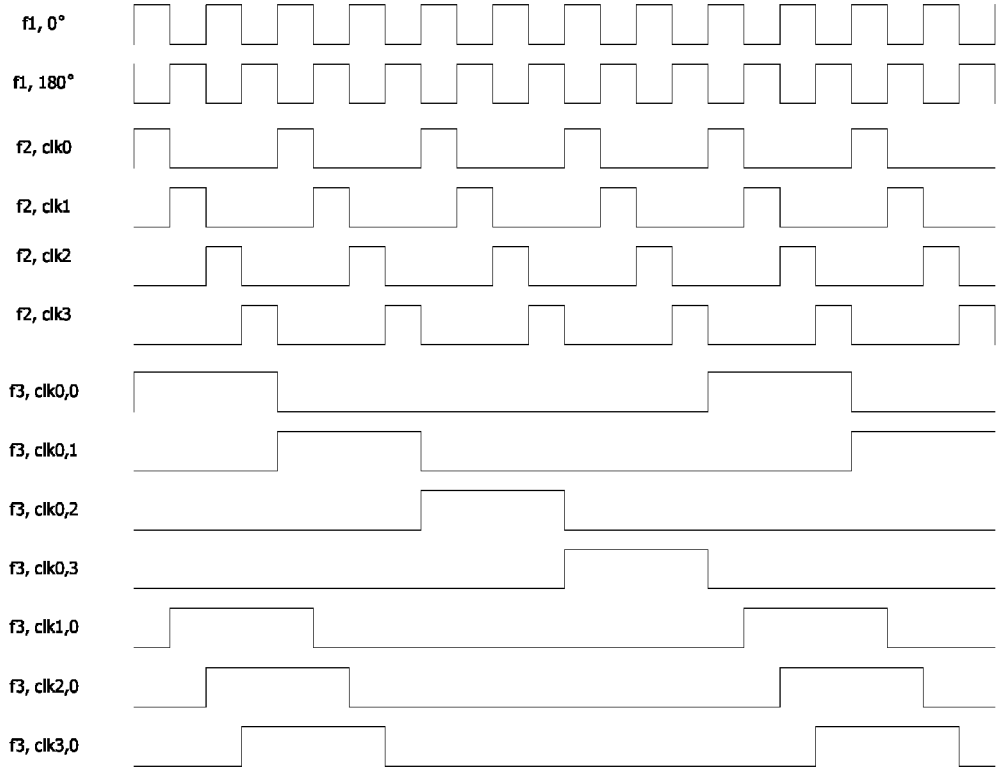
FIG. 9 is a timing diagram showing the generation of clock signals using the second stage sampling clock generator 238 of FIG. 8

The timing diagram of FIG. 9 shows the generation of clock signals using the second stage sampling clock generator of FIG. 8. It should be noted that the rising edges of the related sampling clock signals (f2, clk0 with f3, clk0, 0-3; f2, clk1 with f3, clk1,0-3; f2, clk2 with f3, clk2,0-3; and f2, clk3 with f3, clk3,0-3) are aligned. This alignment can be done by using negative feedback by way of delay locked loop or delay matching between f2 and f3 clock paths stage sampling clock generator and propagating the synchronized reset to 4-phase sampling clock generators in the second stage sampling clock generator.

Figure 10:
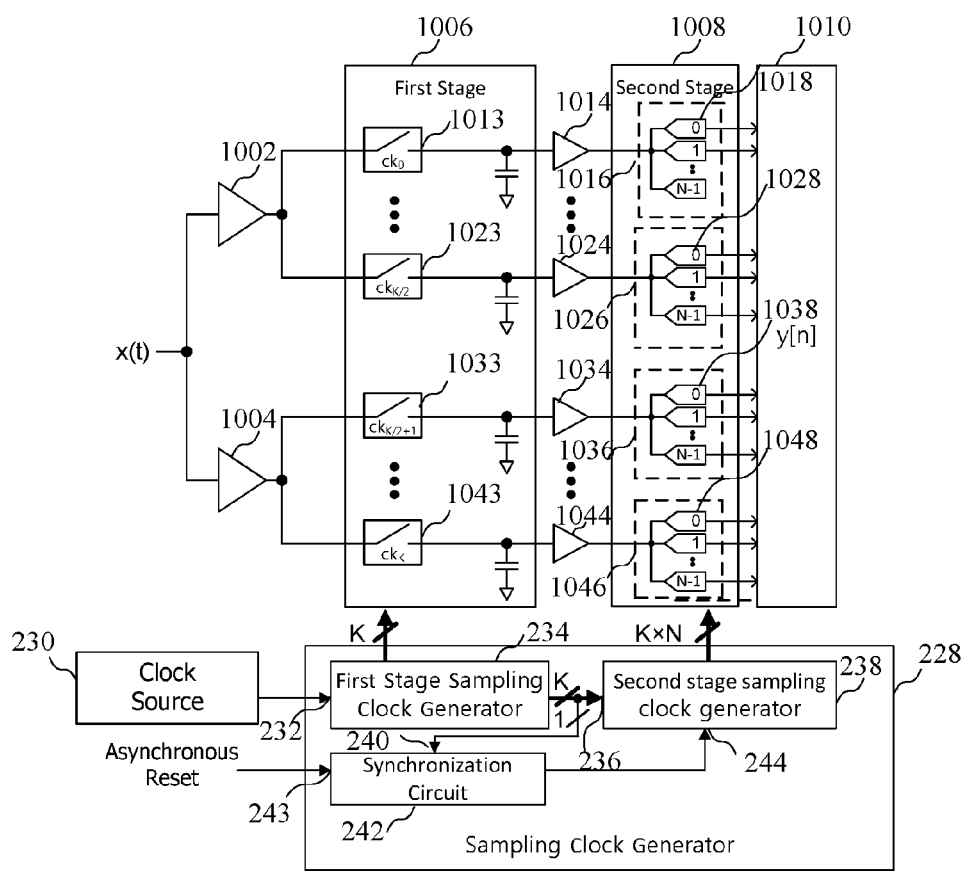
FIG. 10 is a block diagram of another circuit for implementing a time-interleaved analog-to-digital converter.

The two-step sampling TI ADC can have branches at the input. As shown in FIG. 10, a circuit provides a divided path for receiving the analog input signal x(t), which is routed to a first plurality of paths by way of a first amplifier 1002 and a second plurality of paths by a second amplifier 1004. Each of the first and second buffers are coupled to a first stage 1006, the outputs of which are coupled to a second state 1008 having a plurality of ADC converter banks, which generate the digital output y[n] at a memory element 1010. The first amplifier 1002 is coupled to a plurality of switches controlled by clock signals generated by the first stage sampling clock generator 234 as set forth above. The first stage 1006 comprises a first switch 1013 that is coupled to an amplifier 1014, which provides the analog input signal x(t) to a first ADC bank 1016 having a plurality of ADCs 1018. The amplifier 1002 is also coupled to a switch 1023 that is coupled to an amplifier 1024, which provides the analog input signal x(t) to another ADC bank 1026 having a plurality of ADCs 1028.

The first stage 1006 comprises a switch 1033 that is coupled to an amplifier 1034, which provides the analog input signal x(t) to a third ADC bank 1036 having a plurality of ADCs 1038. The amplifier 1004 is also coupled to a switch 1043 that is coupled to an amplifier 1044, which provides the analog input signal x(t) to another ADC bank 1046 having a plurality of ADCs 1048. The routing of the divided clock signals from the sampling clock generator 228 is implemented as described above in reference to FIG. 2. The splitting of the switches and the banks as shown in FIG. 10 include providing a relaxed bandwidth requirement (i.e. reduced by one half) of the first stage sampler of the TI ADC in FIG. 2 due to the branches at the input. The splitting of the switches and the ADC banks also enable the highest sampling clock frequency to be reduced by half. To achieve this bandwidth requirement relaxation, the sampling clock signals in FIG. 8 should have 180 degree of the phase relationship between clock pairs generated by the clock divider 802. As shown in the timing diagram of FIG. 11, the duty cycle of the clock signals coupled to the first stage in the implementation of FIG. 10 is twice the duty cycle of the clock signals coupled to the first stage in the implementation of FIG. 2.

Figure 12:
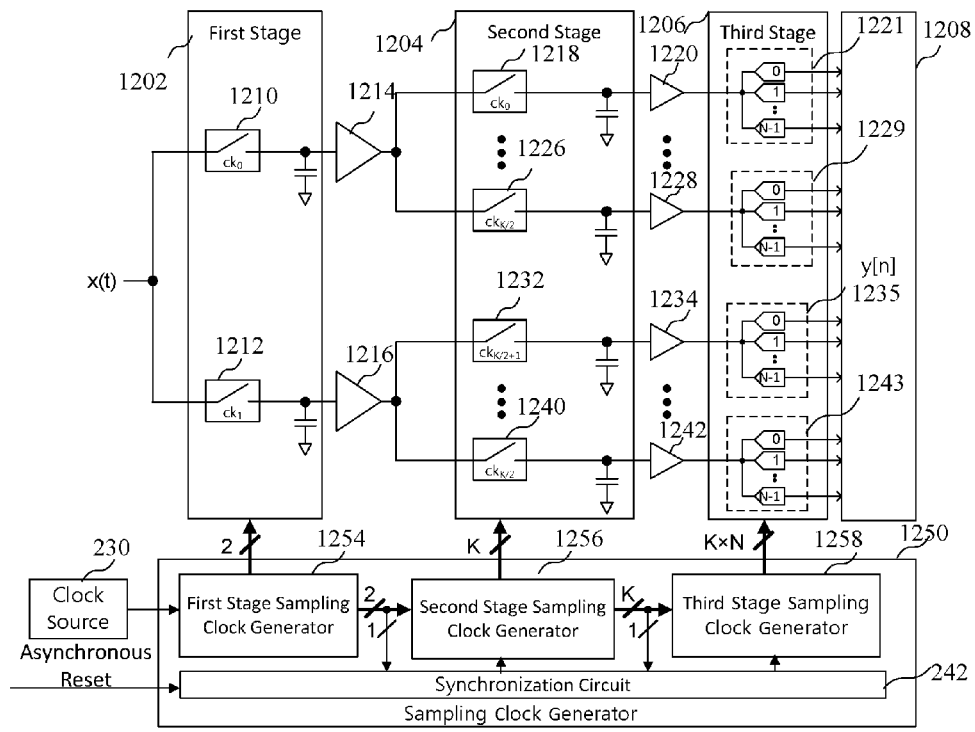
FIG. 12 is a block diagram of circuit having an additional stage for routing an analog input signal to analog-to-digital converters in a time-interleaved analog-to-digital converter.

Turning now to FIG. 12, a block diagram of circuit having an additional stage for routing an analog input signal to analog-to-digital converters in a time-interleaved analog-to-digital converter is shown. More particularly, a first stage 1202 provides a first plurality of switches and a second stage 1204 provides a second plurality of switches for routing the analog input signal x(t) to a third stage 1206 having a plurality of banks of ADCs. The first stage 1202 comprises a first switch 1210 for a first plurality of paths to the ADC circuits and a second switch 1212 for a second plurality of paths to the ADC circuits. The first switch 1210 is coupled to an amplifier 1214, the output of which is coupled to each of a plurality of switches of the second stage 1204, including a switch 1218 coupled to an amplifier 1220 that routes the analog input signal x(t) to a first ADC bank 1221 and a switch 1226 coupled to an amplifier 1228 that routes the analog input signal x(t) to a second ADC bank 1229. The analog input signal x(t) is also routed to a second plurality of ADC circuits by way of the switch 1212. The switch 1212 is coupled to an amplifier 1216, the output of which is coupled to each of a plurality of switches of the second stage 1204, including a switch 1232 coupled to an amplifier 1234 that routes the analog input signal x(t) to a first ADC bank 1235 and a switch 1240 coupled to an amplifier 1242 that routes the analog input signal x(t) to a second ADC bank 1243.

A sampling clock generator that provides clock signals to the stages 1202-1206 is similar to the sampling clock generator of FIG. 2, but includes an additional sampling clock generator for the additional stage of FIG. 12. More particularly, a sampling clock generator 1250 is coupled to receive a reference clock signal from the clock source 230 at a first stage sampling clock generator 1254, which generates a divided clock signal to a second stage sampling clock generator 1256. The first stage sampling clock generator provides two clock signals to control the switches 1210 and 1212. The two clock signals are also provided to the second stage sampling clock generator 1256, which generates K clock signals. A third stage sampling clock generator 1258 generates K×N clock signals that are routed to the ADC circuits of the third stage 1206. It should be noted that the second and third stage sampling clock generators operate in a similar manner as described above in reference to FIG. 2. The synchronization circuit 242 also provides synchronization for the second stage sampling clock generator 1256 and the third stage sampling clock generator 1258, as will be described in more detail in reference to FIG. 13.

Figure 11:
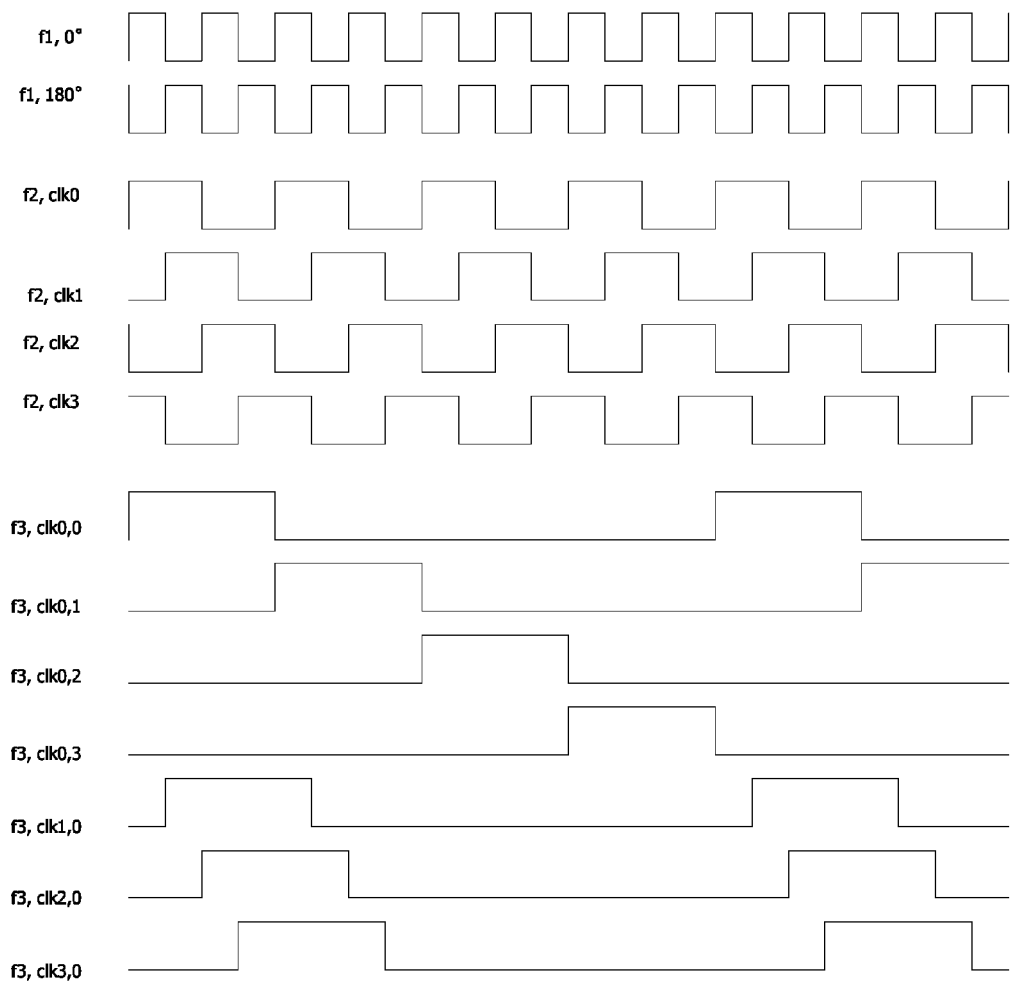
FIG. 11 is a timing diagram showing the generation of clock signals in the circuit of FIG. 10.

Accordingly, FIG. 12 shows a block diagram of three-step sampling TI ADC with a two branches at the input. Even though it has two branches at the input in FIG. 13, any number of first stage switching branches can be implemented at the input. The benefits of this architecture is that only the first stage sampling clock generator is sensitive to clock timing skew since the sampled signal is almost a DC signal after the first sampling clock generator. The reset synchronizer controls the second and third sampling clock generator to provide clock phase order. The structure and operation of the sampling clock signal generation is similar to the one in FIG. 10 and generates the clock signals as shown in FIG. 11.

Figure 13:
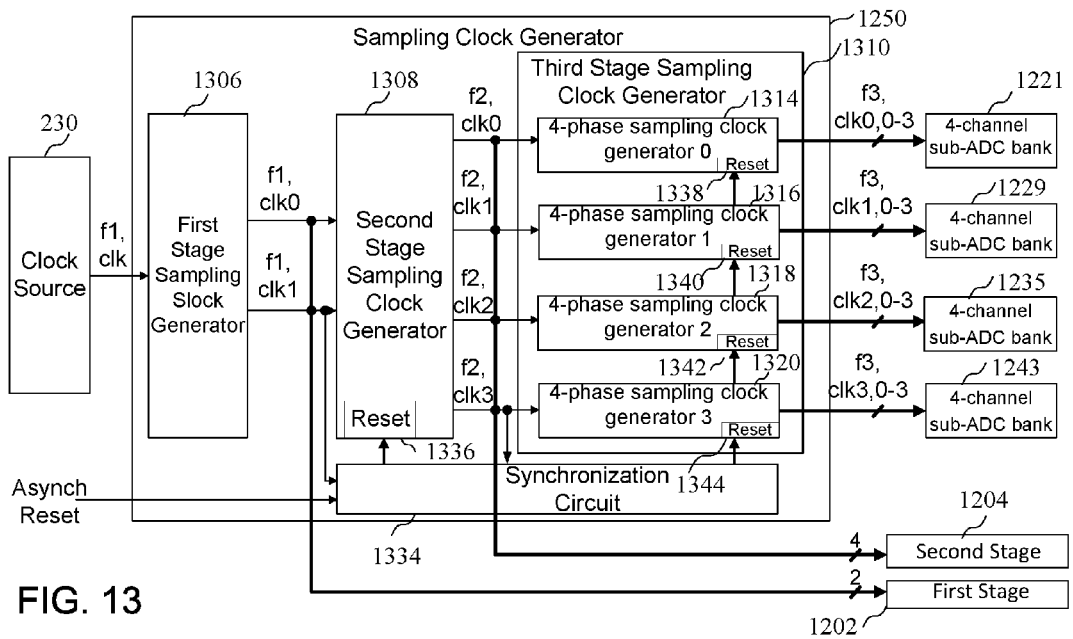
FIG. 13 is a block diagram showing an implementation of the sampling clock generator implemented in the circuit 1250 of FIG. 12.

Turning now to FIG. 13, a block diagram shows an implementation of a sampling clock generator 1250 implemented in the circuit of FIG. 12. The sampling clock generator 1250 of FIG. 13 comprises a first stage sampling clock generator 1306 configured to receive a first clock signal clk at the frequency f1 and to generate clock signals clk0 and clk1 also having the frequency f1. A first and second clock signals clk0 and clk1 are coupled to a second stage sampling clock generator 1308 configured to generator 4 clock signals clk0, clk1, clk2, and clk3 at the frequency f2. The third stage sampling clock generator 1310 comprises a plurality of 4-phase sampling clock generators, including a first sampling clock generator 1314 that generates 4 phases of the clk0 signal at the frequency f3, a second sampling clock generator 1316 that generates 4 phases of the clk1 signal, a third sampling clock generator 1318 that generates 4 phases of the clk 2 signal, and a fourth sampling clock generator 1320 that generates 4 phases of the clk 3 signal. The clock signals f1 clk0 and f1 clk1 at the first frequency are coupled to the switches of the first stage 1202 and the clock signals f2 clk0, f2 clk1, f2 clk2, and f2 clk3 are provided to the second stage 1204. A synchronization circuit 1334 is coupled to receive an asynchronous reset signal and generate a synchronization signal to a reset circuit 1336 of the second stage sampling clock generator 1308, as well as reset circuits 1338-1344 of sampling clock generators of the third stage sampling clock generator 1310. The synchronization circuit 1334 can be implemented as described above in reference to FIG. 5.

Figure 14:
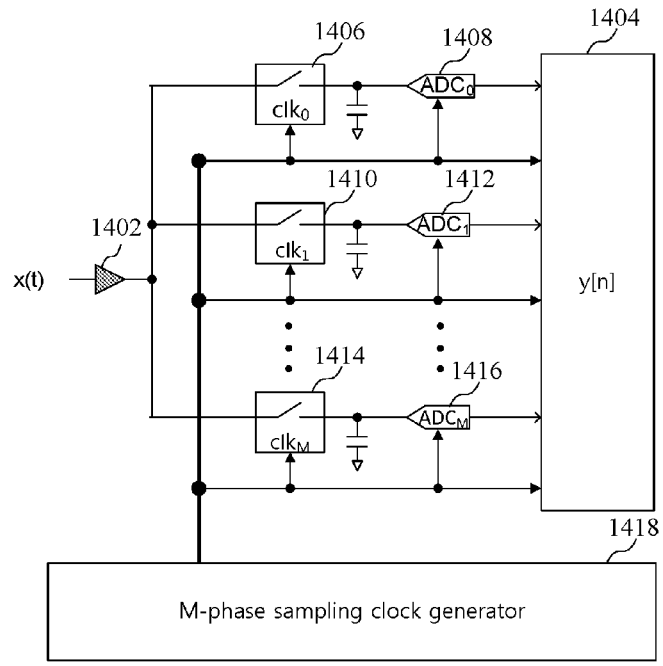
FIG. 14 is a block diagram showing a single-step sampling TI ADC circuit.

Turning now to FIG. 14, a block diagram showing a single-step sampling TI ADC architecture is shown, where examples of clock generators for signal stage TI ADC circuits are shown below. An analog input signal x(t) is coupled to an amplifier 1402 that is coupled to a memory element 1404 by way of a plurality of signal paths having an ADC converter. In particular, a first signal path has a first switch 1406 controlling the routing of the analog input signal to an ADC 1408. Similarly, a second signal path has a second switch 1410 controlling the routing of the analog input signal to an ADC 1412, and a third signal path has a third switch 1414 controlling the routing of the analog input signal to an ADC 1416. This TI ADC architecture is more suitable to lower speed operation (i.e. several GHz sampling frequency range) compared to multi-step TI ADC (i.e. several tens of GHz sampling frequency range). Hereafter, sampling clock generator 1418 for single-step TI ADC will be discussed.

Figure 15:
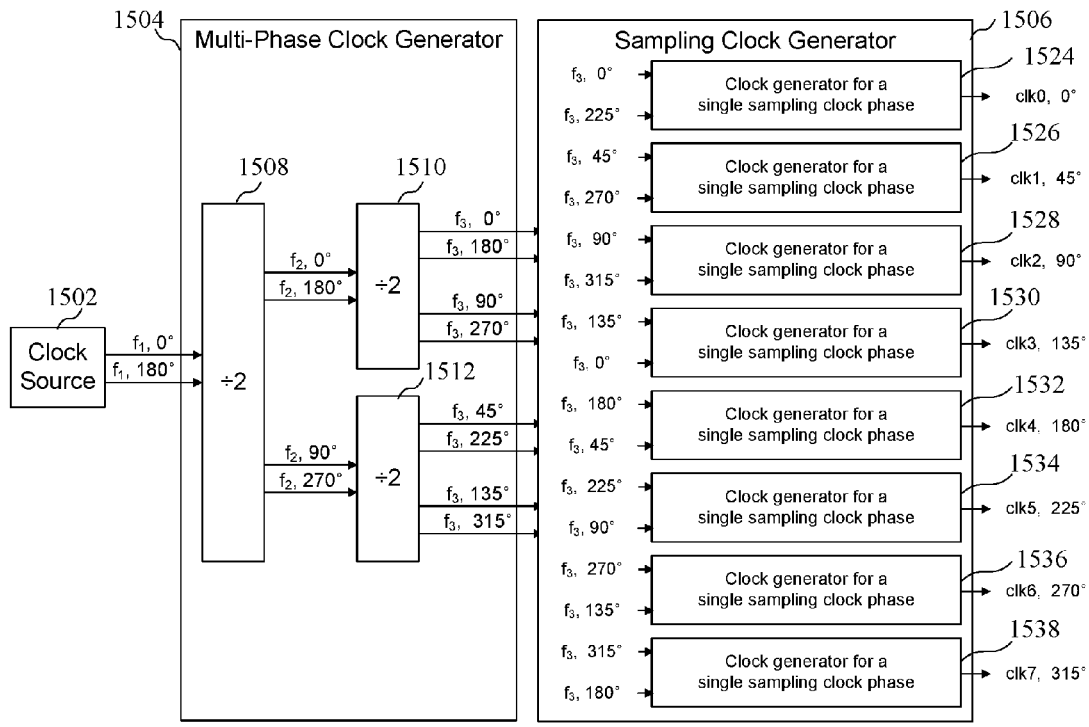
FIG. 15 is a block diagram of a circuit having a plurality of clock dividers that may be implemented as a first stage sampling clock generator.
Figure 16:
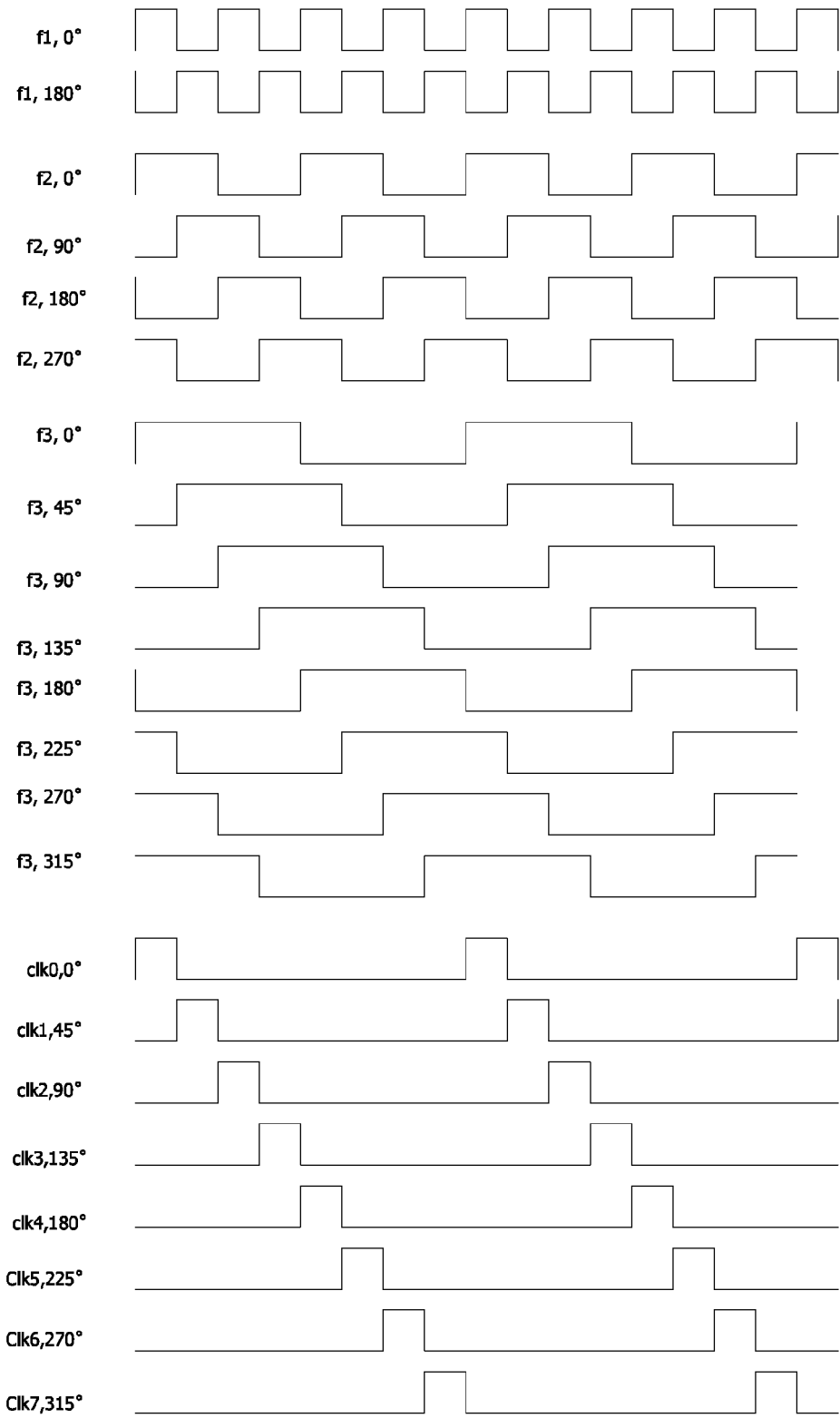
FIG. 16 is a timing diagram showing clock signals generated by the first stage sampling generator of FIG. 15.

Turning now to FIG. 15, a block diagram of a circuit having a dual clock source and clock dividers that may be implemented as a first stage sampling clock generator is shown. The circuit of FIG. 15 comprises a clock source 1502 providing clock signals at the first frequency f1 to a multi-phase clock generator 1504 which generates first divided clock signals at the second frequency f2 and second divided clock signals at the third frequency f3. The third divided clock signals are provided to the sampling clock generator 1506 that generates the correct clock signals at desired phases. More particularly, the clock source 1502 provides two phases of a clock signal to a first divider circuit 1508, outputs of which are provided second divider circuits 1510 and 1512. Eight phases of the input clock signal (e.g. having phases 0°, 45°, 90°, 135°, 180°, 225°, 270°, and 315°) are generated at the third frequency having a fifty percent duty cycle. The sampling clock generator 1506 comprises a plurality of clock generators for a single sampling clock phase 1524-1538 for generating output clock signals at the third frequency, but having a reduced duty cycle, as shown in FIG. 16. That is, each of the clock generators 1524-1538 receives two of the clock signals of the multi-phase clock generator 1504 to generate an output clock signal have a reduced duty cycle.

Figure 17:
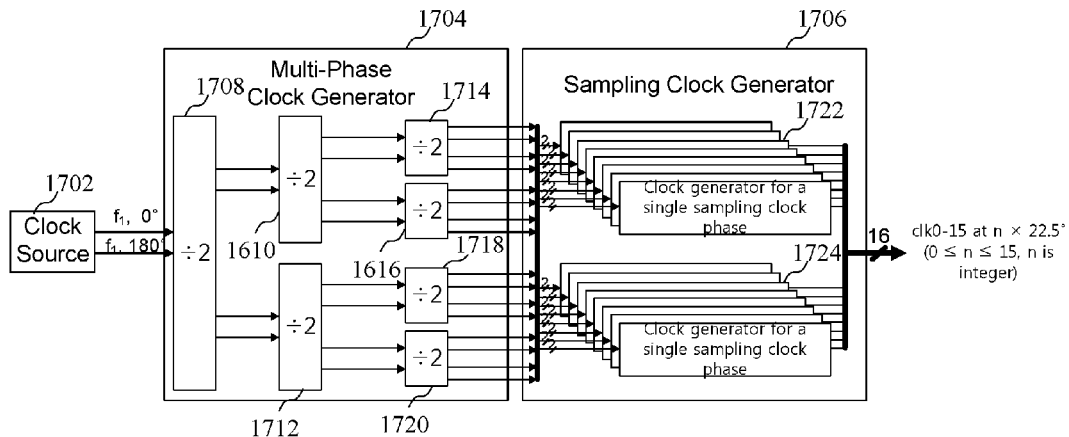
FIG. 17 is a block diagram of a circuit that may be implemented as a first stage sampling clock generator 234.

As shown in FIG. 17, three stages of divided circuits can be implemented to generate 17 output signals that are offset in phase and have a reduced duty cycle to avoid overlap as described above. More particularly, a clock source 1702 provides clock signals to a multi-phase clock generator 1704, which generates 16 phases of the clock signals that are routed to a sampling clock generator 1706. More particularly, outputs of a first divide-by-2 clock divider 1708 are coupled to a second stage of clock dividers 1710 and 1712, as shown in FIG. 15. Outputs of the divider circuits 1710 and 1712 are coupled to another stage of clock divider circuits 1714, 1716, 1718 and 1720. Divided clock signals are provided to clock generators for a single sampling clock phase 1722 and 1724 of the sampling clock generator 1706 to generate 16 output clock signals.

Figure 18:
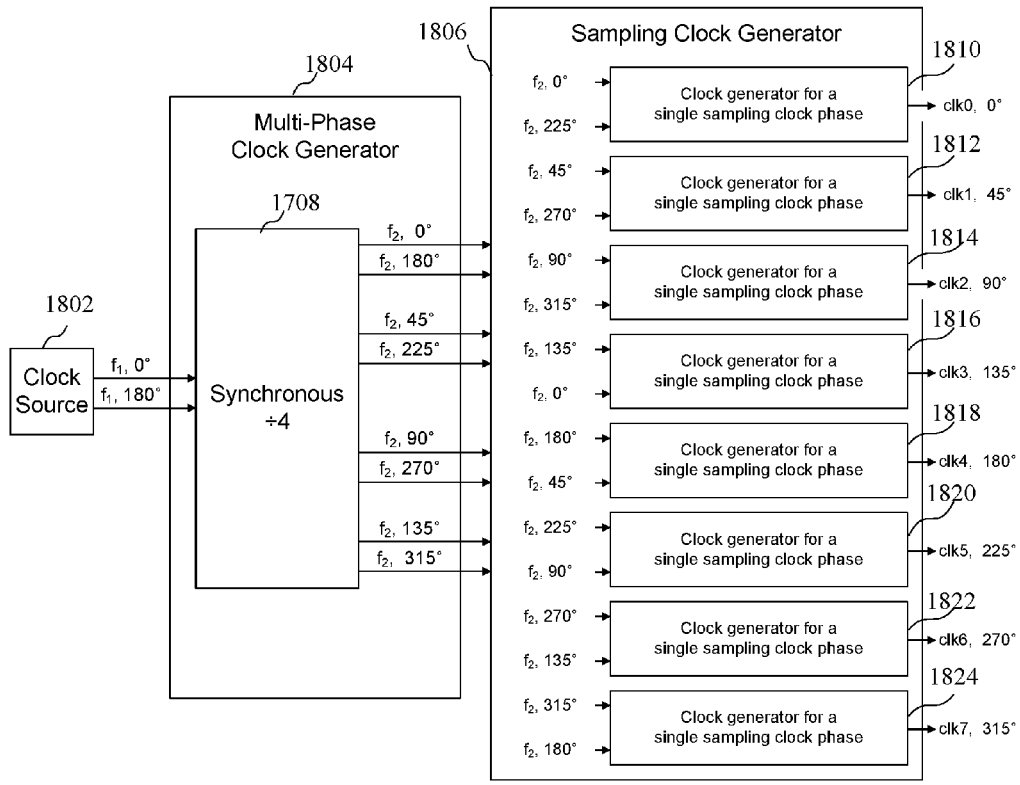
FIG. 18 is another a block diagram of a circuit that may be implemented as a first stage sampling clock generator 234.

Turning now to FIG. 18, a block diagram of a circuit having a synchronous divider that may be implemented as a first stage sampling clock generator is shown. A clock source 1802 provides a pair of phase shifted clock signals, shown here as 0° and 180°, to a multi-phase clock generator 1804, which generates clock signals having the second frequency having different phases that are coupled to a sampling clock generator 1806. A synchronous "divide-by-4" clock divider 1808 generates eight clock signals having different phases and that are at the second frequency. The sampling clock generator comprises a plurality of clock generators for a single sampling clock phase 1810 to 1824, each of which is configured to receive two clock signals generated by the multi-phase clock generator 1804. The two clock signals enable generating output clock signals (clk0, 315°, clk1, 45°, clk2, 90°, clk3, 135°, clk4, 180°, clk5, 225°, clk6, 270°, clk7, 0°) having a reduced duty cycle as described above in reference to FIGS. 15 and 16. The architecture of FIG. 18 can have less jitter and mismatch because a clock-to-Q delay of the synchronous divide-by-4 circuit has approximately half of the delay of an asynchronous divide-by-4 circuit. Since wideband TI ADC is very sensitive to jitter and clock timing skew, it is desirable to minimize jitter and clock timing skew.

Figure 19:
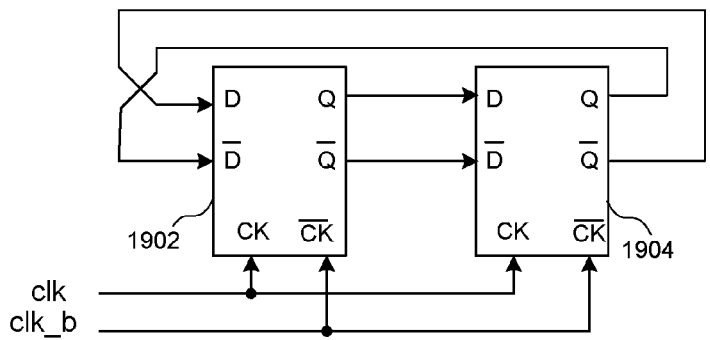
FIG. 19 is a block diagram of a synchronous divider that may be implemented in the circuit of FIG. 18.

Turning now to FIG. 19, a block diagram of a synchronous divider that may be implemented in the circuit of FIG. 19 is shown. In particular, a pair of D flip-flops 1902 and 1904 are configured as shown to generate a synchronous "divide-by-4" clock divider, where the an inverter output (Q_b) of the D flip-flop is provided to the D input of the D flip-flop 1902 and the output (Q) of the D flip-flop 1904 is provided to the inverted D input of the D flip-flop 1902. The outputs Q and Q_b are divided clock signals that are generated in response to the clk and clk_b clock signals.

Figure 20:
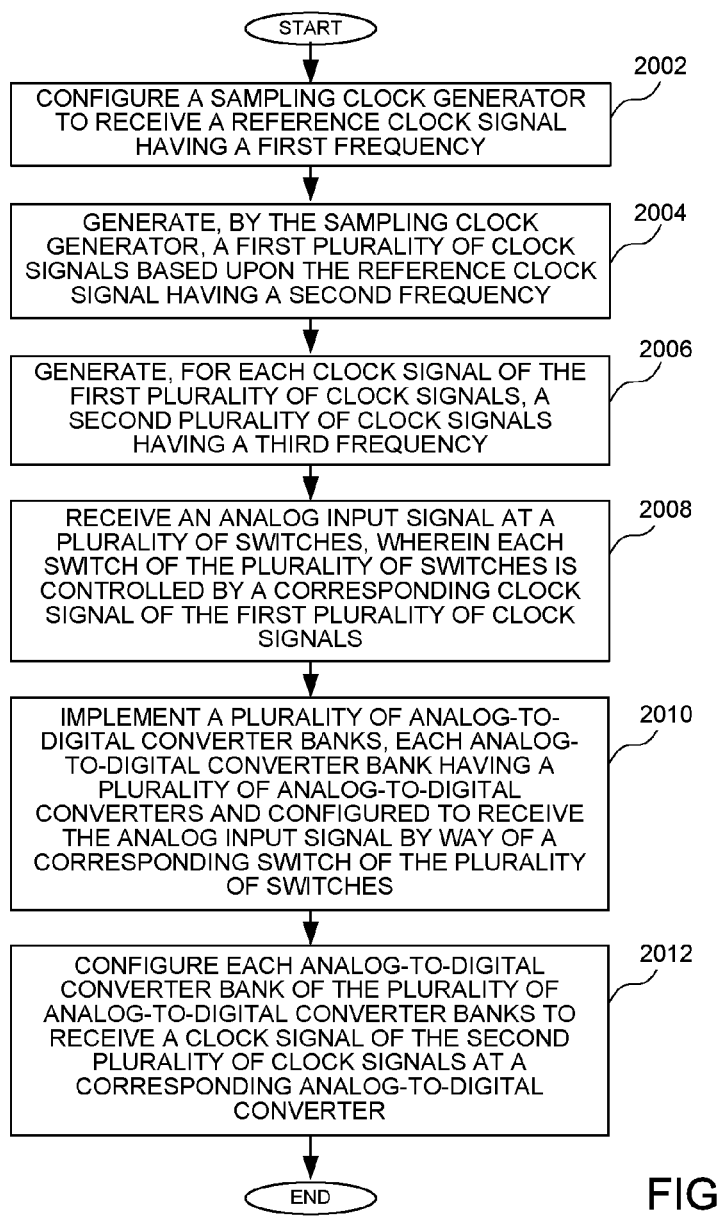
FIG. 20 is a flow chart showing a method of implementing a time-interleaved analog-to-digital converter.

Turning now to FIG. 20, a flow chart shows a method of implementing a time-interleaved analog-to-digital converter. The method of FIG. 20 could be implemented using the circuits of FIGS. 1-19 as described. A sampling clock generator, such as clock source 230, is configured to receive a reference clock signal having a first frequency at a block 2002. A first plurality of clock signals are generated by the sampling clock generator based upon the reference clock signal having a second frequency at a block 2004. A second plurality of clock signals having a third frequency is generated, for each clock signal of the first plurality of clock signals, at a block 2006. The first and second plurality of clock signals could be generated as described in the timing diagrams of FIGS. 7, 11 and 15, for example.

An analog input signal is received at a plurality of switches at a block 2008, wherein each switch of the plurality of switches is controlled by a corresponding clock signal of the first plurality of clock signals. The plurality of switches could be the switches of the first stage 204 of FIG. 2, for example. A plurality of analog-to-digital converter banks implementing at a block 2010, where each analog-to-digital converter bank has a plurality of analog-to-digital converters and is configured to receive the analog input signal by way of a corresponding switch of the plurality of switches. The plurality of analog-to-digital converters could be the analog-to-digital converters of the second stage 212, for example. Each analog-to-digital converter bank of the plurality of analog-to-digital converter banks is configured to receive a clock signal of the second plurality of clock signals at a corresponding analog-to-digital converter at a block 2012.

It can therefore be appreciated that new to circuits for and methods of implementing a time-interleaved analog-to-digital converter circuit in an integrated circuit have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for implementing a time-interleaved analog-to-digital converter circuit, the circuit comprising:
    a sampling clock generator configured to receive a reference clock signal having a first frequency, the sampling clock generator having a first stage sampling clock generator configured to generate a first plurality of clock signals based upon the reference clock signal and having a second frequency, and a second stage sampling clock generator configured to generate, for each clock signal of the first plurality of clock signals, a second plurality of clock signals having a third frequency;
    a first stage having a plurality of switches configured to receive an analog input signal, wherein each switch of the plurality of switches is controlled by a corresponding clock signal of the first plurality of clock signals; and
    a second stage having a plurality of analog-to-digital converter banks, each analog-to-digital converter bank having a plurality of analog-to-digital converters and configured to receive the analog input signal by way of a corresponding switch of the plurality of switches; and
    wherein each analog-to-digital converter bank of the plurality of analog-to-digital converter banks is configured to receive a plurality of clock phases of a corresponding clock signal of the second plurality of clock signals.

2. The circuit of claim 1 wherein the first stage sampling clock generator comprises a multi-phase clock generator generating divided clock signals at different phases and having the second frequency.

3. The circuit of claim 2 wherein the first stage sampling clock generator further comprises a sampling clock generator configured to receive the divided clock signals and to adjust a duty cycle and a delay of the divided clock signals to generate the first plurality of clock signals.

4. The circuit of claim 1 wherein the second stage sampling clock generator comprises a plurality of phase sampling clock generators, and each phase sampling clock generator is configured to receive a clock signal of the first plurality of clock signals and generate divided clock signals at different phases and having the third frequency.

5. The circuit of claim 4 wherein the sampling clock generator further comprises a synchronization circuit configured to receive a clock signal of the first plurality of clock signals and to generate a synchronization signal in response to a reset signal.

6. The circuit of claim 5 wherein each phase sampling clock generator of the plurality of phase sampling clock generators comprises a reset circuit, and wherein, for each phase sampling clock generator, the reset circuit aligns the synchronization signal to a clock signal coupled to the phase sampling clock generator.

7. The circuit of claim 1 further comprising a first buffer and a second buffer each configured to receive the analog input signal, wherein a first portion of switches of the plurality of switches is configured to receive the analog input signal by way of the first buffer and a second portion of switches of the plurality of switches is configured to receive the analog input signal by way of the second buffer.

8. The circuit of claim 1 further comprising an intermediate stage between the first stage and the second stage, the intermediate stage having a second plurality of switches configured to receive the analog input signal, wherein each switch of the second plurality of switches is controlled by a corresponding clock signal of a third plurality of clock signals.

9. The circuit of claim 8 wherein the sampling clock generator further comprises an intermediate stage sampling clock generator having a clock generator configured to generate divided clock signals at different phases and based upon the first plurality of clock signals.

10. The circuit of claim 9 wherein the sampling clock generator further comprises a synchronization circuit configured to receive a clock signal of the first plurality of clock signals and to generate synchronization signals coupled to the intermediate stage and the second stage in response to a reset signal.

11. A method of implementing a time-interleaved analog-to-digital converter, the method comprising:
    configuring a sampling clock generator to receive a reference clock signal having a first frequency;
    generating, by the sampling clock generator, a first plurality of clock signals based upon the reference clock signal and having a second frequency;
    generating, for each clock signal of the first plurality of clock signals, a second plurality of clock signals having a third frequency;
    receiving an analog input signal at a plurality of switches, wherein each switch of the plurality of switches is controlled by a corresponding clock signal of the first plurality of clock signals; and
    implementing a plurality of analog-to-digital converter banks, each analog-to-digital converter bank having a plurality of analog-to-digital converters and configured to receive the analog input signal by way of a corresponding switch of the plurality of switches;
    wherein each analog-to-digital converter bank of the plurality of analog-to-digital converter banks is configured to receive a plurality of clock phases of a corresponding clock signal of the second plurality of clock signals.

12. The method of claim 11 wherein generating the first plurality of clocks signals comprises generating, based on the reference clock signal, divided clock signals at different phases and having the second frequency.

13. The method of claim 12 wherein generating the first plurality of clocks signals comprises adjusting a duty cycle and a delay of the divided clock signals.

14. The method of claim 11 further comprising implementing a plurality of phase sampling clock generators, wherein each phase sampling clock generator is configured to receive a clock signal of the first plurality of clock signals and generate divided clock signals at different phases and having the third frequency.

15. The method of claim 14 further comprising configuring a synchronization circuit to receive a clock signal of the first plurality of clock signals and to generate a synchronization signal in response to a reset signal.

16. The method of claim 15 further comprising implementing, for each phase sampling clock generator of the plurality of phase sampling clock generators, a reset circuit, and wherein, for each phase sampling clock generator, the reset circuit aligns the synchronization signal to a clock signal coupled to the phase sampling clock generator.

17. The method of claim 11 further comprising configuring a first buffer and a second buffer to receive the analog input signal, wherein a first portion of switches of the plurality of switches is configured to receive the analog input signal by way of the first buffer and a second portion of switches of the plurality of switches is configured to receive the analog input signal by way of the second buffer.

18. The method of claim 11 further comprising implementing an intermediate stage between the first stage and the second stage, the intermediate stage having a second plurality of switches configured to receive the analog input signal, wherein each switch of the second plurality of switches is controlled by a corresponding clock signal of a third plurality of clock signals.

19. The method of claim 18 wherein the implementing the intermediate stage comprises generating divided clock signals at different phases and based upon the first plurality of clock signals.

20. The method of claim 19 further comprising implementing a synchronization circuit to receive a clock signal of the first plurality of clock signals and to generate synchronization signals coupled to the intermediate stage and the second stage in response to a reset signal.

\* \* \* \* \*